United States Patent [19]

McCoy

[11] Patent Number: 5,437,946
[45] Date of Patent: Aug. 1, 1995

[54] MULTIPLE RETICLE STITCHING FOR SCANNING EXPOSURE SYSTEM

[75] Inventor: John H. McCoy, San Carlos, Calif.

[73] Assignee: Nikon Precision Inc., Belmont, Calif.

[21] Appl. No.: 205,865

[22] Filed: Mar. 3, 1994

[51] Int. Cl.$^6$ .............................................. G03F 9/00
[52] U.S. Cl. ........................................ 430/5; 430/321;
430/322; 355/53; 355/77
[58] Field of Search ......................... 430/5, 321, 322;
355/53, 71, 77

[56] References Cited

U.S. PATENT DOCUMENTS

| | | | |
|---|---|---|---|
| 3,819,265 | 6/1974 | Feldman et al. | 355/51 |
| 4,924,257 | 5/1990 | Jain | 355/53 |
| 5,194,893 | 3/1993 | Nishi | 355/53 |

OTHER PUBLICATIONS

Jere D. Buckley et al., "Step-and-scan lithography using reduction optics," J. Vac. Sci. Technol. B 7(6), Nov./Dec. 1989, pp. 1607–1612.

Ronald E. Sheets et al., "Scanning Projection Exposure Tools for Large Area Thin Film Displays," 1994 Display Manufacturing Technology Conference, Digest of Technical Papers, SID, First Edition, Jan. 1994, pp. 97–98.

David E. Kettering, "Applying Step-and-Repeat Technologies to Produce Liquid Crystal Display ICs," Reprinted from Microelectronic Manufacturing and Testing, Jun. 1987, pp. 1–3.

James P. Rominger, "Seamless Stitching for Large Area Integrated Circuit Manufacturing," SPIE vol. 922 Optical/Laser Microlithography (1988), pp. 188–193.

*Primary Examiner*—S. Rosasco
*Attorney, Agent, or Firm*—Skjerven, Morril, MacPherson, Franklin & Friel; Brian D. Ogonowsky

[57] ABSTRACT

An improved method for stitching together reticle patterns on a substrate is described. One or more reticles, whose reticle border patterns are to be blended together on the substrate, are provided on an X-Y movable stage in a scanning type exposure system. Each of the reticles has a border pattern which is identical to the border pattern of at least one of the other reticles so that, when the images of these reticles border patterns overlap on the substrate, the overlapping border patterns effectively form a single image on the substrate. To prevent the double exposure of the overlapping border patterns from overexposing the photoresist and to reduce any detrimental effects resulting from misalignment between the overlapping patterns, either a triangular end portion of the scanning source, a filter, or a movable blind is used to partially shade the overlapping border pattern as the UV source is scanned over the border pattern. The graded exposures of the photoresist by the overlapping border patterns combine to fully expose the overlapping border patterns on the substrate. This procedure is continued so as to provide repeated reticle patterns in two dimensions which blend together.

23 Claims, 6 Drawing Sheets

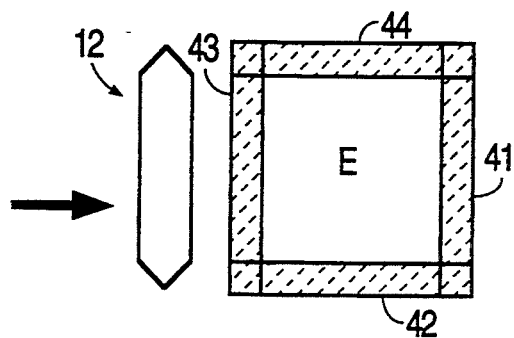
FIG. 11
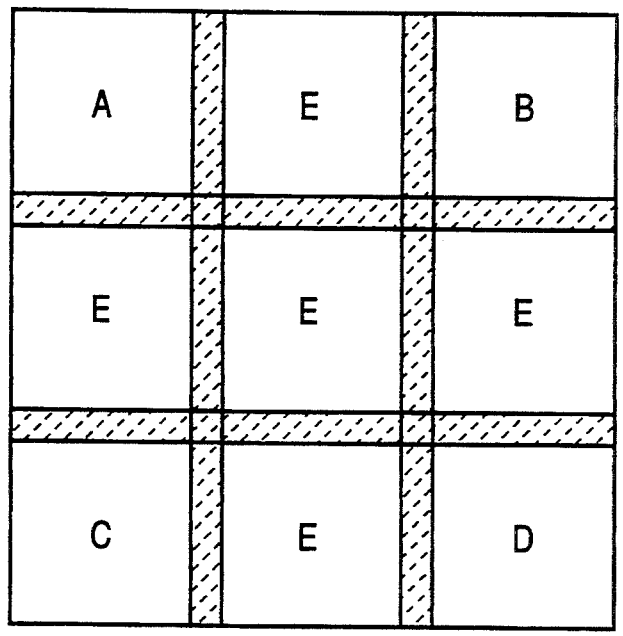
FIG. 12
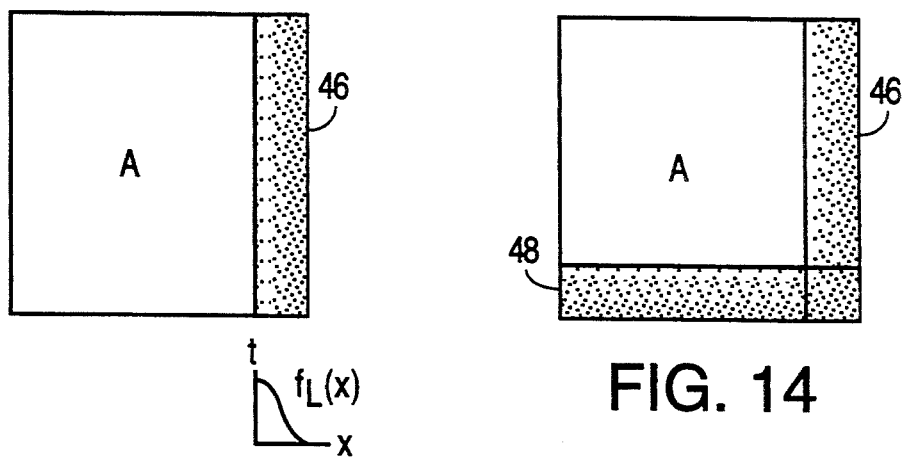
FIG. 13
FIG. 14

MULTIPLE RETICLE STITCHING FOR SCANNING EXPOSURE SYSTEM

FIELD OF THE INVENTION

This invention relates to photolithographic processes and, in particular, to an improved method for blending a number of reticle patterns together on a substrate to form a single large image on the substrate.

BACKGROUND OF THE INVENTION

Flat panel liquid crystal display (LCD) arrays may be formed using a photolithographic method, where a repeated reticle image is used for patterning a large portion of the entire array. The reticle may be mounted on a precision step-and-repeat stage in a projection exposure system to incrementally expose portions of a photoresist layer on a substrate to the reticle pattern until the entire intended array area has been exposed. In this way, a single reticle can be used to create a very large pattern containing a repeated reticle pattern.

It has been found difficult to precisely match up the edge of a previously exposed reticle pattern on a substrate with the edge of the stepped reticle image adjacent to the previously exposed reticle pattern. Precise alignment of reticle patterns is not critical if flat panel transistors are not formed at the boundary between adjacent reticle patterns.

However, precise alignment and some degree of overlap of adjacent patterns are required to properly form transistors along the boundary of adjacent reticle patterns. Consequently, for these types of flat panel arrays there is some imperfect overlap between adjacent reticle patterns which may be visually perceived upon a close inspection of the resulting flat panel display. The imperfectly overlapping patterns are perceived in the final display because this imperfect overlap distorts the resulting transistor pattern and increases the exposure time of the photoresist layer over the substrate when forming the array. The exposure time of a photoresist layer to masked radiation affects the line widths of the features formed in the photoresist. Whether these line widths are reduced or enlarged depends upon whether the photoresist is a positive or negative photoresist and on the particular processing used to fabricate the array.

In a high quality thin film transistor (TFT) LCD array, the manufacturer typically does not want more than a 0.1–0.2 micron feature change in the portion of the array where the reticle patterns overlap, since a greater change in feature size will significantly affect the brightness (i.e., transistor gain) of a pixel located in that portion of the array. In a typical process for forming a TFT LCD array, an overlap between adjacent reticle patterns is about 1 mm. Each pixel is approximately 0.2 mm, so that the overlap affects five pixels. Hence, if this overlapped portion is not a precise overlap or is too overexposed due to the double exposures from adjacent reticle images, the abrupt increased brightness of five adjacent pixels around each reticle pattern may be perceived by the user.

What is needed is an improved process for stitching together repeated reticle patterns formed in a photoresist layer on a substrate so as to precisely blend the borders of the repeated reticle patterns.

SUMMARY

An improved method for stitching together reticle patterns formed in a photoresist layer on a substrate is described. The substrate may be the type used for forming a flat panel display. In a preferred embodiment, a scanning type exposure system is used having a source of ultraviolet (UV) radiation which is scanned with respect to the reticle. In this preferred embodiment, the source of UV radiation outputs an oblong radiation field having a triangular portion at each end of the oblong field. The intensity of radiation outputted at the triangular ends is thus proportionately less than the radiation outputted along the straight section of the field.

One or more reticles, whose reticle patterns are to be stitched together on the substrate, are provided on an X-Y movable stage. Each of the reticles has a border pattern which is identical to the border pattern of at least one of the other reticles so that, when the images of these reticles border patterns overlap on the substrate, the overlapping border patterns effectively form a single image on the substrate.

In a first step of one embodiment of the process, a first reticle is aligned over a first area of the substrate, and the source of radiation is scanned left to right with respect to the reticle. The upper and lower border patterns of the reticle will be scanned by the triangular ends of the oblong radiation field to obtain a graded exposure of the photoresist layer by these border patterns.

The left and right border patterns of the reticle are partially shaded by a graded filter or by a movable blind to obtain a graded exposure of the photoresist layer by these border patterns.

In a second step, the same reticle or a different reticle is aligned with respect to the first reticle pattern formed on the substrate so that a left border pattern of this second reticle, which is perpendicular to the direction of scanning, creates a border pattern image which overlaps the right border pattern on the substrate formed by the first reticle in the previous scanning step. Thus, as the source of radiation is scanned over the second reticle from left to right, the overlapping border patterns will effectively double expose the photoresist layer. To prevent this double exposure from overexposing the photoresist and to prevent any misalignment between the overlapping patterns from causing a perceptible change in pixel brightness across the overlapped portion, either the filter or the movable blind is again used to partially shade the overlapping border pattern as the UV source is scanned over the border pattern. The graded exposures of the photoresist by the overlapping left and right border patterns combine to fully expose the overlapping border patterns on the substrate. The graded exposures also cause any misalignment of the overlapped patterns to produce a gradual change in the pixel brightness across the overlapped portion such that this gradual change is not perceived by the user. This procedure is continued so as to provide repeated reticle patterns which blend together in the direction of scanning.

In order to blend in a reticle's upper or lower border pattern, arranged parallel to a direction of scanning, with an identical border pattern already formed in the substrate, the triangular end of the radiation field provides a graded intensity profile along the overlapping border patterns so that the double exposure of the photoresist to these upper and lower border patterns does not overexpose the photoresist and so that any misalignment between the overlapping patterns causes only a gradual change in pixel brightness across the overlapped portions.

Using the above method, a single reticle pattern can be repeated over an entire substrate surface while blending in the edges of the reticle image in both a direction parallel to the direction of scanning and perpendicular to the direction of scanning. This method also allows the blending of patterns from multiple reticles, using the same concepts, to create, for example, a large central pattern for a flat panel array and an edge pattern for the array.

BRIEF DESCRIPTION OF THE DRAWINGS

FIG. 11 illustrates an alternative embodiment of the invention where a single reticle on an X-Y stage is used in conjunction with a scanning exposure system to expose a large area of a photoresist layer on a substrate.

FIG. 12 is a top-down view of a photoresist exposure pattern using the reticle of FIG. 11 in conjunction with the reticles of FIG. 1.

FIGS. 13 and 14 illustrate filters for providing graded exposure levels in a photoresist layer by one or more border patterns in a reticle.

DETAILED DESCRIPTION OF THE PREFERRED EMBODIMENTS

The concepts described in this disclosure enable one to use a single reticle or multiple reticles to pattern a large area of photoresist on a substrate, where the area may be much larger than the image from a single reticle. The edges of the reticle patterns imaged onto the substrate are blended together in both the X and Y directions on the substrate.

FIGS. 1-10 illustrate the use of multiple reticles.

Figure 1:
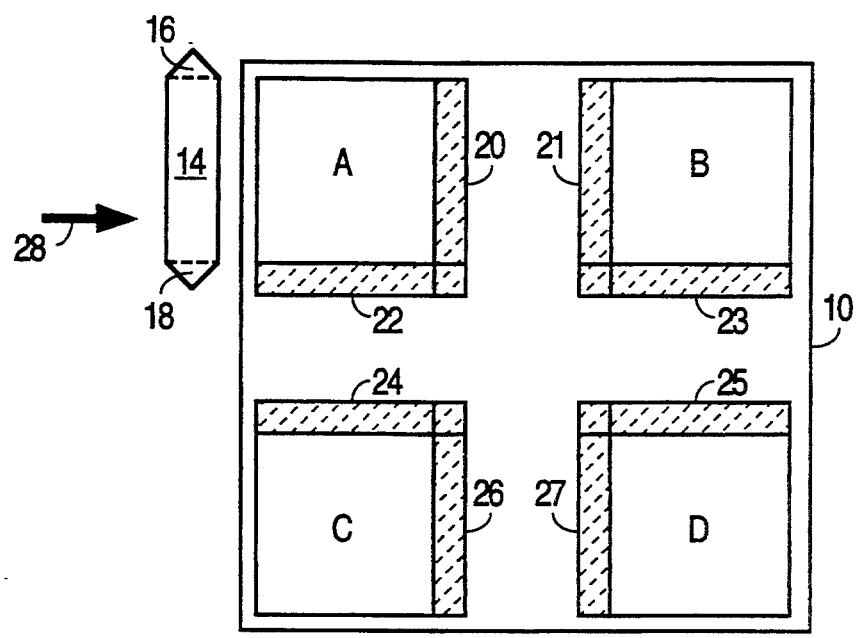
FIG. 1 is a simplified, top-down view of four reticles arranged on an X-Y movable stage in a scanning exposure system.

FIG. 1 is a simplified top-down view of four separate reticles A, B, C, and D arranged on a X-Y movable stage 10. Suitable X-Y stages are well known, and the construction of a high-precision X-Y stage will not be described herein. Stage 10 should be able to position reticles A-D within an alignment tolerance of 0.2 microns. This may be achieved using interferometers or by aligning targets on the reticles with targets formed on the substrate. Preferably, reticles A-D are prealigned with respect to stage 10 so that precise positioning of the stage brings each of reticles A-D into proper position with respect to the substrate. This saves time by not having to realign each reticle A-D at the time of exposure.

Figure 15:
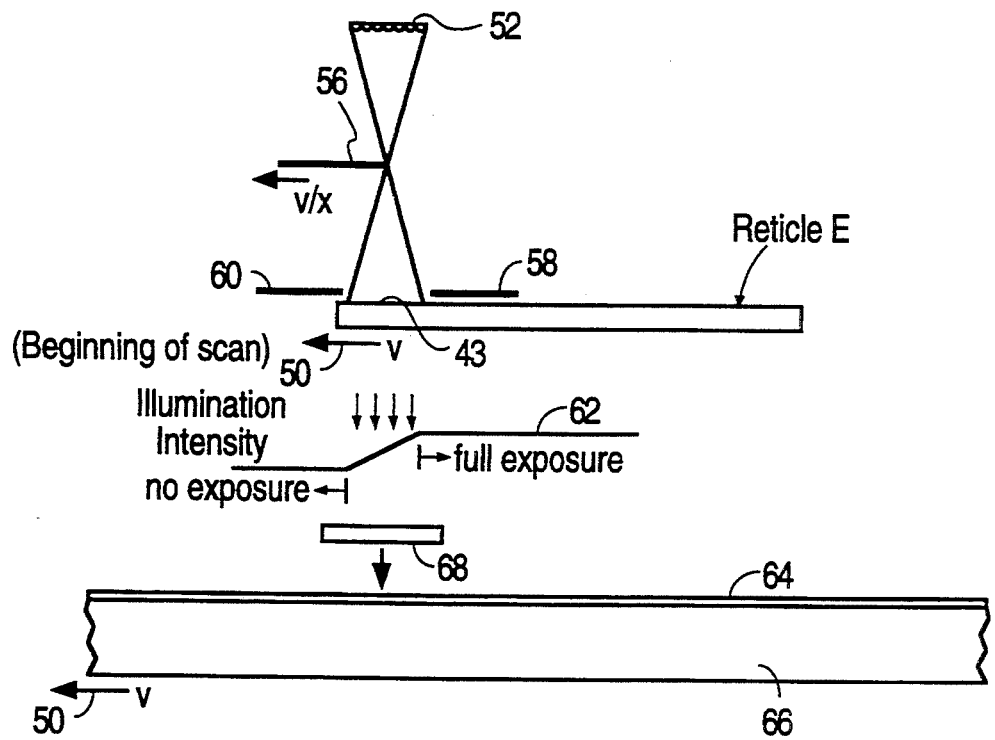
FIGS. 15 and 16 illustrate a simplified scanning exposure arrangement where graded exposure levels in a photoresist layer by the border patterns of a reticle are obtained using a movable blind.
Figure 16:
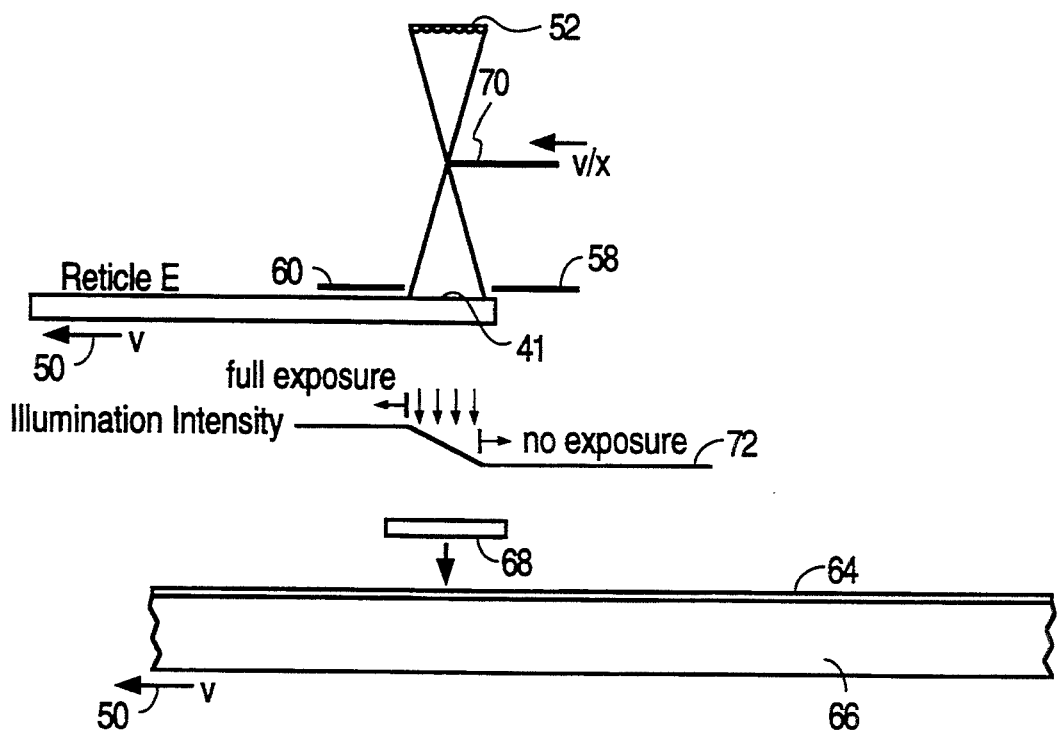

Stage 10 is incorporated into a known type of scanning exposure system such as that described in U.S. Pat. Nos. 5,194,893, 4,924,257 or 3,819,265, the patents being incorporated herein by reference. In a scanning exposure system, as opposed to a step-and-repeat type exposure system, the field produced by a source of ultraviolet (UV) radiation is oblong, having a length at least as long as the length of the reticle to be scanned. The radiation source is typically held stationary while the reticle is moved with respect to the radiation source and interposed between the radiation source and a substrate. The substrate is moved along with the reticle in a certain direction and speed dependent upon the particular optics used in the scanning exposure system. FIGS. 15 and 16, to be described in detail later, illustrate a scanning exposure system where a scanned reticle image is focused on a substrate using an optics system.

FIG. 1 incorporates a radiation source having a particular scanning field which is represented by the hexagonal scanning field 12. In the scanning field 12, a first level of light intensity is outputted along the entire rectangular portion 14 of scanning field 12, and a graded intensity of light is outputted at triangular ends 16 and 18 of scanning field 12. Such a hexagonal shaped scanning field 12 may be produced by a similar shaped template interposed between a source of ultraviolet light and the reticle. A similar type of hexagonal scanning field is described in U.S. Pat. No. 4,924,257.

The borders patterns 20-27 of the reticles A, B, C, and D are to selectively mask a graded intensity of radiation. The border patterns which face one another are identical to one another. For example, border pattern 20 is identical to border pattern 21, and border pattern 22 is identical to border pattern 24.

In a first step of the illustrated embodiment, stage 10 is positioned as shown in FIG. 1 so that the scanning field 12 will scan reticle A from left to right, as shown by arrow 28. A conventional substrate (either silicon, glass, or other known substrate) with a layer of photoresist over it is positioned such that the stage 10 is interposed between the radiation field 12 and the substrate.

Field 12 is then scanned with respect to reticle A and the substrate so as to expose the layer of photoresist in a pattern corresponding to the pattern of reticle A. In a preferred embodiment, stage 10 and the substrate are moved while field 12 remains stationary. Stationary optical elements focus the reticle pattern on the substrate.

Figure 2:
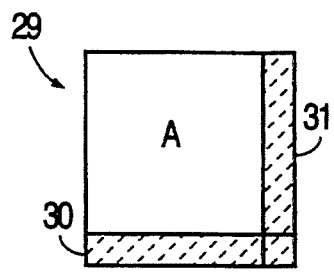
FIG. 2 is a top-down view of an exposed pattern in a photoresist layer after a first scanning step using the configuration of FIG. 1.

The resulting exposure pattern 29 in the photoresist layer is shown in FIG. 2. Later, when the photoresist layer is developed, the exposed portions of the photoresist corresponding to the pattern in reticle A will be dissolved if the photoresist is a positive photoresist. If the photoresist is a negative photoresist, the exposed portions of the photoresist harden, and the unexposed portions of the photoresist are dissolved away in the development process.

The bottom border portion 30 (corresponding to border pattern 22) of the exposed photoresist layer shown in FIG. 2 is only partially exposed, and this partial exposure is proportional to the dimensions of the triangular end 18 in the field 12 of FIG. 1. The right border portion 31 (corresponding to border pattern 20) shown in FIG. 2 has also been partially exposed, preferably with an intensity gradient identical to that which exposed border portion 30, using either a filter or a movable blind, as will be described later with respect to FIGS. 13-18.

Figure 3:
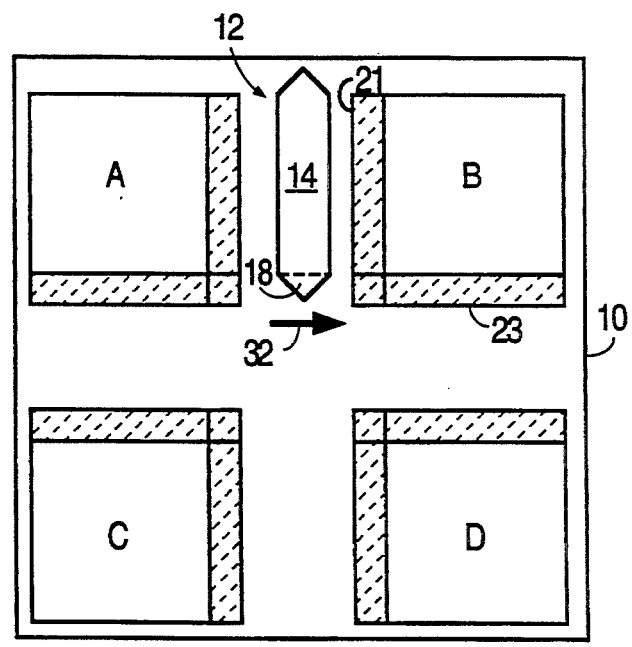
FIG. 3 illustrates the configuration of FIG. 1 but prior to a second scanning step being performed.

In a next step of the preferred process using multiple reticles, the stage 10 is moved, as shown in FIG. 3, such that reticle B is in position for scanning under field 12. The image of reticle B on the substrate should now be aligned with the pattern 29 of reticle A already formed in the photoresist layer (FIG. 2) such that the border pattern 21 of reticle B aligns with and overlaps the border portion 31 formed in the photoresist layer.

Figure 4:
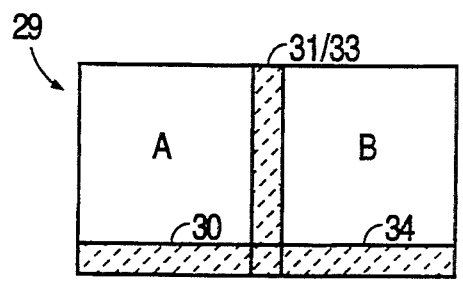
FIG. 4 is a top-down view of the exposed photoresist pattern after the second scanning step.

Radiation field 12 then scans reticle B and the substrate in the direction of arrow 32 so as to pattern the photoresist as shown in FIG. 4 where border portions 31 and 33 in the photoresist layer now overlap. Border portion 33 corresponds to border pattern 21 in FIG. 1. The grading of light intensity (using means to be described later) as the border patterns 20 and 21 are scanned is such that the combined exposure of the photoresist where border patterns 20 and 21 overlap equals the exposure of the photoresist within the central portions of the resulting exposure patterns 29 from reticles A and B.

At this stage, the bottom border portions 30 and 34 (corresponding to border patterns 22 and 23) in the photoresist layer of FIG. 4 are equally exposed with a graded intensity profile proportional to the triangular shape of triangular end 18 of the scanning field 12.

Figure 5:
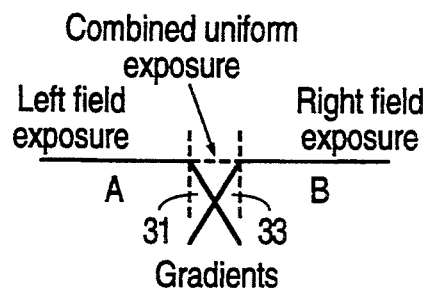
FIG. 5 illustrates the graded exposures of overlapping reticle patterns using the methods described herein.

FIG. 5 illustrates the exposure of the photoresist layer as the border patterns 20 and 21 of reticles A and B are scanned. Note how the combined exposures of the overlapping border portions 31 and 33 precisely equal the exposure of the photoresist at the central portions of the patterns created by reticle A and reticle B.

This process of blending reticle patterns along a border perpendicular to the direction of scanning may be used repeatedly to create a merged pattern of any length in a substrate. In an alternative embodiment, reticles A and B may have border patterns on all four sides which are to be blended, rather than on just two sides. One such reticle with four border patterns to be blended is shown in FIG. 11, to be described in greater detail later.

FIGS. 6-10 illustrate the blending of border patterns in a direction parallel to the direction of scanning of field 12.

Figure 6:
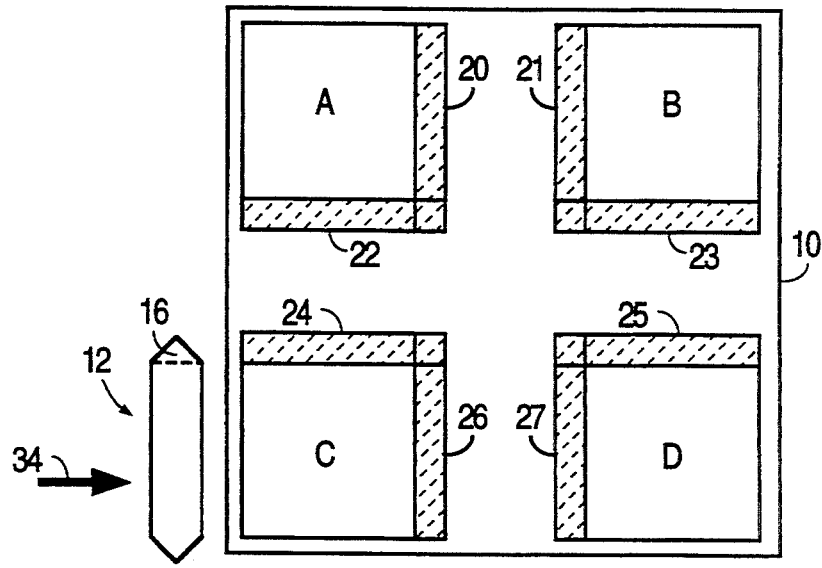
FIG. 6 illustrates the configuration of FIG. 1 prior to a third scanning step being performed.
Figure 7:
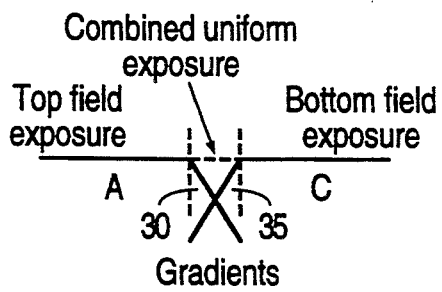
FIG. 7 illustrates the graded exposures of overlapping reticle patterns using the methods described herein.

In a next step, shown in FIG. 6, stage 10 and the substrate are positioned such that the image of reticle C is now aligned with respect to the pattern 29 (FIG. 4) of reticle A formed in the photoresist layer such that the top border pattern 24 of reticle C precisely overlaps the bottom border portion 30 (FIG. 4) formed in the photoresist. The field 12 is then scanned in a direction shown by arrow 34 to expose the photoresist. The triangular end 16 of field 12 provides a graded light intensity over border pattern 24 of reticle C such that the combined exposure of the photoresist layer to the overlapping border patterns 22 and 24 equals the exposure of the photoresist layer at the central portions of the patterns created by reticles A and C, as shown in FIG. 7. Border portion 35 in FIG. 7 corresponds to border pattern 24 of reticle C.

Figure 8:
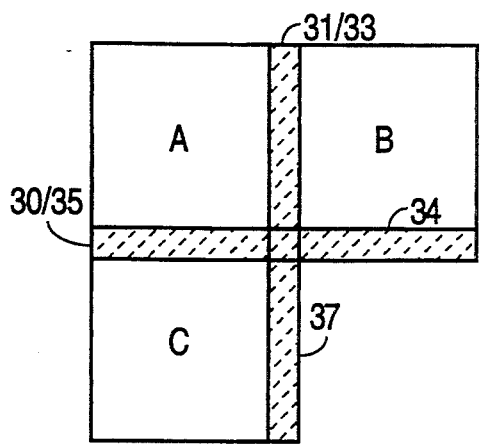
FIG. 8 is a top-down view of the exposed photoresist pattern after the third scanning step.

The resulting exposure pattern of the photoresist layer is shown in FIG. 8. Border portion 37 in the photoresist layer corresponds to border pattern 26.

Figure 9:
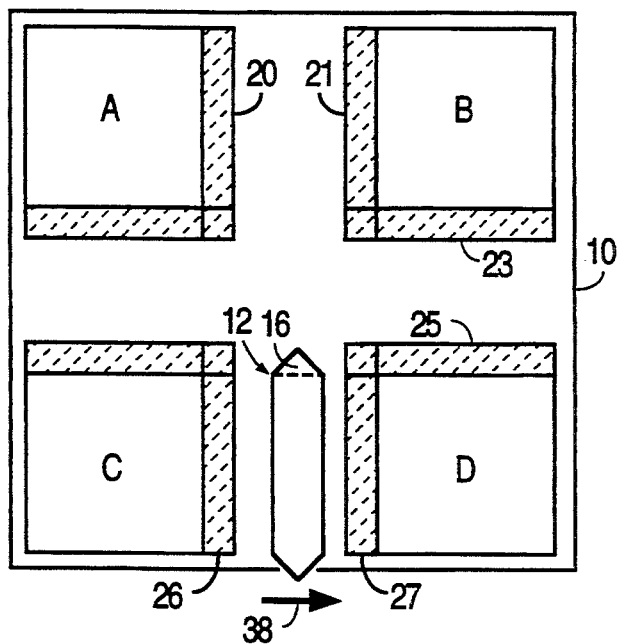
FIG. 9 illustrates the configuration of FIG. 1 prior to a fourth scanning step.

In FIG. 9, stage 10 and the substrate are again positioned so that the image of reticle D is now aligned with the patterns of reticles B and C formed in the photoresist such that the border patterns 25 and 27 of reticle D overlap the border portions 34 and 37, respectively, already formed in the photoresist layer. The field 12 is then scanned in the direction of arrow 38 so as to expose the photoresist layer to the reticle pattern. The graded light intensity provided by triangular end 16 causes the combined exposure of the photoresist by border patterns 23 and 25 to be equal to the exposure of the photoresist at the central portion of the patterns created by reticles B and D. The method for blending the border patterns 26 and 27 is identical to the method use for blending the border patterns 20 and 21 and is performed using a filter or a movable blind, to be described later.

Figure 10:
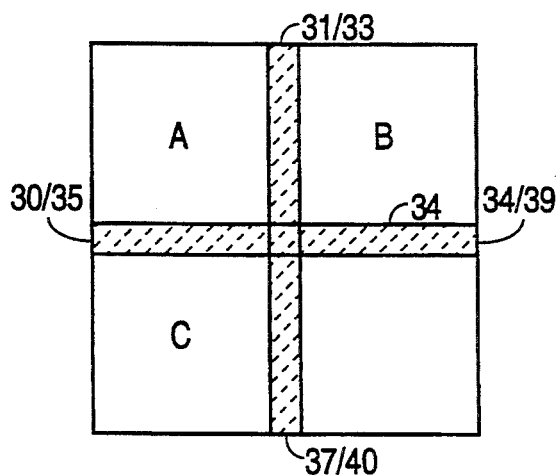
FIG. 10 is a top-down view of the completed photoresist exposure pattern after the fourth scanning step.

The resulting exposure pattern in the photoresist is shown in FIG. 10. Border portions 39 and 40 correspond to border patterns 25 and 27, respectively, in reticle D.

FIG. 11 illustrates a single reticle E whose pattern is intended to be repeated over a large area of the photoresist layer. Reticle E has borders 41-44 which overlap an opposing border of reticle E as the image of reticle E is used to repeatedly expose the photoresist layer on the substrate. For a flat panel array, reticle E may be used to pattern a central portion of the array, while reticles A, B, C, and D in FIG. 10 may be used to pattern edge portions (e.g., I/O circuitry) of the array. Reticle E may be placed on a movable stage 10 by itself or may be placed on stage 10 along with reticles A-D. The positioning and scanning process described with respect to FIGS. 1-10 may then be carried out along with the scanning of reticle E to produce an even larger pattern, such as shown in FIG. 12, where the pattern of reticle E forms the central portion of the complete pattern formed in the photoresist layer, and the patterns of reticles A-D form the edge portions of the complete pattern.

The single reticle E can also be used in a step-and-repeat type exposure system by employing the various filters or blinds described herein on all four border patterns on the reticle during the exposure process to provide a graded exposure across the borders 41-44.

The final patterned photoresist layer is then developed and processed using conventional techniques. The developed photoresist may then be used as a mask for any underlying layers to form the various transistors and interconnections needed to create a conventional flat panel array. Such processing of an exposed photoresist layer and subsequent steps to form a flat panel array are conventional and will not be discussed in detail. This process may also be used to form integrated circuits of any size on a semiconductor substrate.

Methods for grading the radiation intensity as the radiation is scanned over the border patterns perpendicular to the direction of scanning of field 12 are described with respect to FIGS. 13–18.

FIG. 13 shows the use of a neutral density filter 46, in conjunction with reticle A, whose filtering characteristics achieve the exposure gradient shown in FIG. 5 along the right border portion 31 in FIG. 2. Filter 46 is depicted using halftones to represent the effective shading provided by filter 46 of the radiation impinging on the right border pattern 20 of reticle A. The resulting luminous flux ($f_L$) passed by filter 46 along its width is graphically represented in FIG. 13. Filter 46 may be used in either a scanning type exposure system or a conventional step-and-repeat exposure system. A filter identical to filter 46 would be used to partially block radiation through each of border patterns 20, 21, 26, 27, 41 and 43, shown in FIGS. 1 and 11, located perpendicular to the direction of scanning. No filter is needed along the top and bottom border patterns (e.g., border patterns 22 and 24 in FIG. 1) since the graded light intensity is provided by the triangular ends 16 and 18 of field 12.

If reticle A were to be tiled in two dimensions in a step-and-repeat type exposure system, or if scanning field 12 did not incorporate triangular ends 16 and 18, filters 46 and 48, shown in FIG. 14, may be positioned over the remaining borders of reticle A. The overlap of the filters 46 and 48 produces a two-dimensional filter at the corner of reticle A.

Filters 46 and 48 may be created by forming a random or quasi-random array of opaque chrome dots on the reticle itself. (A regular array of dots would cause undesirable diffraction and Moiré effects.) The random dot distribution corresponds to the halftone density shown in FIGS. 13 and 14. These chrome dots must each be small enough so as to not be resolved at the particular wavelength of light used to expose the photoresist. Alternatively, the filtering provided by filters 46 and 48 may be provided by a separate filter mask which is positioned in the optical path of the radiation so as to partially shade the substrate or the border pattern on the reticle. The filter is preferably located so as to be out-of-focus on the substrate surface. The creation of variable density filters for achieving any gradient of light intensity is well known in the art and need not be discussed further.

FIG. 15 illustrates a preferred structure where, instead of using neutral density filters, a movable blind is used to partially shade the border pattern on a reticle. FIG. 15 illustrates reticle E from FIG. 11 having a left border pattern 43 being currently scanned by a radiation source 52. The reticle E is being moved in the direction shown by arrow 50. To provide partial shading of the radiation intensity impinging on border pattern 43, a movable left blind 56 is initially inserted into the optical path between radiation source 52 and border pattern 43. Fixed main slit blinds 58 and 60 are fixed in position and limit the field of radiation to a field similar to field 12 in FIG. 1. As illustrated by the illumination intensity level 62, a photoresist layer 64 on a flat panel array substrate 66 is being partially exposed by an image of the border pattern 43 due to the movable left blind 56.

As reticle E is scanned to the left, substrate 66 is also scanned to the left along with movable left blind 56. Blind 56 is moved to the left at a speed depending on the speed of reticle E and the width of border pattern 43 (i.e., on the extent of overlap between reticle patterns). Blind 56 should be completely removed from the optical path as the right edge of border pattern 43 moves under fixed blind 60 such that anything to the right of border pattern 43 is fully exposed on the photoresist layer 64.

The optics used to focus the reticle E pattern onto the photoresist layer 64 is symbolized by block 68.

As shown in FIG. 16, a movable right blind 70 is provided to control the illumination intensity 72 impinging on right border pattern 41 of reticle E. As illustrated in FIGS. 15 and 16, the movable left blind 56 is moved out of the optical path after the beginning of a scan, and the movable right blind 70 is moved into the optical path at the end of the scan to achieve the respective intensity gradients 62 and 72.

Figure 17:
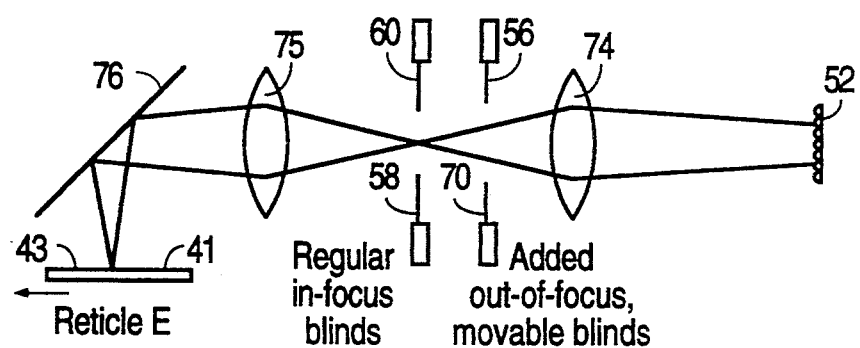
FIG. 17 is a simplified illustration of an exposure system showing how movable blinds may be arranged with respect to an optics system.

FIGS. 15 and 16 are, of course, simplified embodiments without details of the optics system and the mechanism for moving the blinds 56 and 70. Such optics and required mechanisms would be understood by those skilled in the art after a review of this disclosure, and implementing such optics and mechanisms would be within the skill of one skilled in the art. FIG. 17 illustrates one possible optics system which may be used in conjunction with the systems described with respect to FIGS. 15 and 16. The various blinds 56, 58, 60 and 70 are shown along with lenses 74, 75, and mirror 76.

Figure 18:
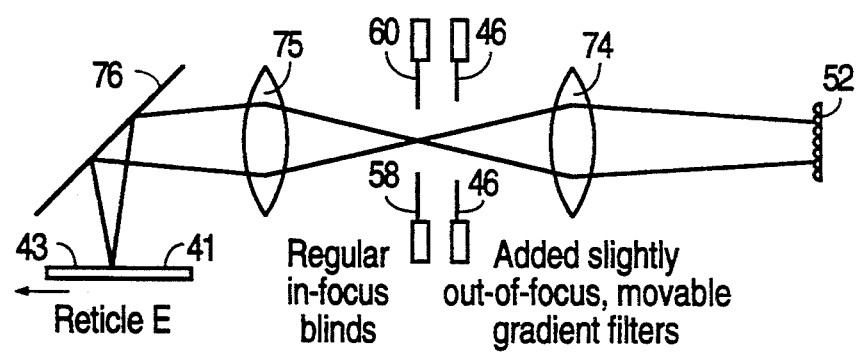
FIG. 18 is a simplified illustration of an exposure system showing how filters may be arranged with respect to an optics system.

FIG. 18 illustrates one embodiment of a structure using movable filters, such as filter 46 shown in FIG. 13, to achieve the desired light intensity gradient profile. Filters 46 would be fixed in position as the border portions 41 and 43 of reticle E are being scanned and removed completely during scanning of the central portion of reticle E.

The concepts of using fixed filters, movable filters, and movable blinds may also be applied to a step-and-repeat type exposure system where the grading of light intensity is performed in both the X and Y direction on the surface of a substrate by using the filters and blinds described herein. FIGS. 17 and 18 can be used to illustrate such a step-and-repeat system, where the filters and blinds provide a graded light intensity in the X direction. A duplicate set of filters or blinds would be incorporated to provide a graded light intensity in the Y direction.

Any combination of the above-described features may be used to achieve the desired light intensity profiles necessary to blend in the border patterns of one or more reticles on a substrate. The graded light intensity profiles avoid overexposure of the overlapped patterns and reduce any detrimental effects from misalignment of the overlapped patterns.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for stitching reticle patterns together on a target substrate, said method comprising the steps of:
    providing a first reticle on an X-Y movable stage in a scanning projection exposure system, said first reticle having a first pattern formed thereon, said first pattern having four sides, said four sides including a first side adjacent to a second side, a third side adjacent to said second side and opposing said first side, and a fourth side adjacent to said third side and opposing said second side, said first side having a border portion containing a first border pattern, said second side having a border portion containing a second border pattern, said third side having a border portion containing a third border pattern, and said fourth side having a border portion containing a fourth border pattern;

positioning said X-Y movable stage such that said first pattern is imaged onto a first surface area of a target substrate;

scanning a source of radiation across said first reticle in a scan direction substantially parallel to said second side such that a first exposed pattern is formed in said first surface area of said substrate, said first exposed pattern containing a first exposed border pattern corresponding to said first border pattern, a second exposed border pattern corresponding to said second border pattern, a third exposed border pattern corresponding to said third border pattern, and a fourth exposed border pattern corresponding to said fourth border pattern;

partially blocking said radiation impinging on said substrate as said source of radiation scans over said first border pattern, an intensity of said radiation impinging on said substrate as said source of radiation is scanned over said first border pattern having a graded intensity profile;

positioning said X-Y movable stage such that said first pattern on said first reticle is imaged onto a second surface area of said substrate, and an image corresponding to said third border pattern overlaps said first exposed border pattern on said first surface area of said substrate;

scanning said source of radiation across said first reticle in a scanning direction substantially parallel to said second side such that said first exposed pattern is formed in said second surface area of said substrate, said first exposed pattern formed in said second surface area containing a third exposed border pattern overlapping said first exposed border pattern previously formed in said first surface area; and partially blocking said radiation impinging on said substrate as said source of radiation scans over said third border pattern, an intensity of said radiation impinging on said substrate as said source of radiation is scanned over said third border pattern having a graded intensity profile such that an overlapping exposure of said first exposed border pattern in said first surface area and said third exposed border pattern in said second surface area approximately equals an exposure of a central portion of said first exposed pattern in said first surface area and said first exposed pattern in said second surface area.

2. The method of claim 1 further comprising the steps of:

positioning said X-Y movable stage such that said first pattern is imaged onto a third surface area of said substrate and an image corresponding to said second border pattern overlaps said fourth exposed border pattern on said first surface area of said substrate;

scanning said source of radiation across said first reticle substantially parallel to said second side such that said first exposed pattern is formed in said third surface area of said substrate, said second exposed border pattern in said third surface area overlapping said fourth exposed border pattern in said first surface area; and controlling an intensity of said radiation impinging upon said substrate as said source of radiation is scanned over said fourth border pattern and said second border pattern such that an overlapping exposure of said fourth exposed border pattern in said first surface area and said second exposed border pattern in said third surface area approximately equals an exposure of a central portion of said first exposed pattern in said first surface area and said first exposed pattern in said third surface area.

3. The method of claim 2 wherein said source of radiation scanned over said first reticle outputs an oblong field of radiation having a length substantially parallel to said first side of said first reticle, said oblong field having a first triangular end and a second triangular end, said first triangular end scanning over said second border pattern to produce a graded intensity of said radiation when said source is scanned over said second border pattern.

4. The method of claim 3 wherein said second triangular end is scanned over said fourth border pattern to produce a graded intensity of said radiation when said source is scanned over said fourth border pattern.

5. The method of claim 1 wherein said radiation is partially blocked as said source of radiation scans over said first border pattern by using a movable blind positioned in a radiation path only when said source of radiation scans over said first border pattern.

6. The method of claim 5 wherein said radiation is partially blocked as said source of radiation scans over said third border pattern by using a movable blind positioned in a radiation path only when said source of radiation scans over said third border pattern.

7. The method of claim 1 wherein said radiation is partially blocked as said source of radiation scans over said first border pattern by using a filter positioned in a radiation path only when said source of radiation scans over said first border pattern.

8. The method of claim 7 wherein said radiation is partially blocked as said source of radiation scans over said third border pattern by using a filter positioned in a radiation path only when said source of radiation scans over said third border pattern.

9. The method of claim 7 wherein said filter is formed on said first reticle over said first border pattern.

10. The method of claim 7 wherein said filter is formed separated from said first reticle.

11. The method of claim 1 further comprising the steps of:

providing a second reticle on said X-Y movable stage, said second reticle having a second pattern formed thereon, said second pattern having four sides, said four sides including a fifth side, said fifth side having a border portion containing a fifth border pattern, said fifth border pattern being substantially identical to said first border pattern;

positioning said X-Y movable stage such that said second pattern is imaged onto a third surface area of said substrate, and an image corresponding to said fifth border pattern overlaps said first exposed border pattern previously formed on said second surface area of said substrate;

scanning said source of radiation across said second reticle in a scan direction substantially perpendicular to said fifth side such that said third surface area of said substrate is exposed to said second pattern to form a second exposed pattern in said third area and form a fifth exposed border pattern corresponding to said fifth border pattern; and partially blocking said radiation impinging on said substrate as said source of radiation scans over said fifth border pattern, an intensity of said radiation impinging on said substrate as said source of radiation is scanned over said fifth border pattern having a graded intensity profile such that an overlapping exposure of said first exposed border pattern in said second area and said fifth exposed border pattern in said third surface area approximately equals an exposure of a central portion of said first exposed pattern in said second surface area and a central portion of said second exposed pattern in said third surface area.

12. A method for stitching reticle patterns together on a target substrate, said method comprising the steps of:

providing a first reticle and a second reticle on an X-Y movable stage in a scanning projection exposure system, said first reticle having a first pattern formed thereon, said first pattern having four sides, said four sides including a first side adjacent to a second side, a third side adjacent to said second side and opposing said first side, and a fourth side adjacent to said third side and opposing said second side, said first side having a border portion containing a first border pattern, said second side having a border portion containing a second border pattern, said third side having a border portion containing a third border pattern, and said fourth side having a border portion containing a fourth border pattern, said second reticle having a second pattern formed thereon, said second pattern having four sides, said four sides including a fifth side, said fifth side having a border portion containing a fifth border pattern, said fifth border pattern being substantially identical to said first border pattern;

positioning said X-Y movable stage such that said first pattern is imaged onto a first surface area of a target substrate;

scanning a source of radiation across said first reticle in a scan direction substantially parallel to said second side such that a first exposed pattern is formed in said first surface area of said substrate, said first exposed pattern containing a first exposed border pattern corresponding to said first border pattern, a second exposed border pattern corresponding to said second border pattern, a third exposed border pattern corresponding to said third border pattern, and a fourth exposed border pattern corresponding to said fourth border pattern;

partially blocking said radiation impinging on said substrate as said source of radiation scans over said first border pattern, an intensity of said radiation impinging on said substrate as said source of radiation is scanned over said first border pattern having a graded intensity profile;

positioning said X-Y movable stage such that said second pattern on said second reticle is imaged onto a second surface area of said substrate, and an image corresponding to said fifth border pattern overlaps said first exposed border pattern on said first surface area of said substrate;

scanning said source of radiation across said second reticle in a scanning direction substantially perpendicular to said fifth side such that a second exposed pattern is formed in said second surface area of said substrate, said second exposed pattern formed in said second surface area containing a fifth exposed border pattern overlapping said first exposed border pattern previously formed in said first surface area; and partially blocking said radiation impinging on said substrate as said source of radiation scans over said fifth border pattern, an intensity of said radiation impinging on said substrate as said source of radiation is scanned over said fifth border pattern having a graded intensity profile such that an overlapping exposure of said first exposed border pattern in said first surface area and said fifth exposed border pattern in said second surface area approximately equals an exposure of a central portion of said first exposed pattern in said first surface area and a central portion of said second exposed pattern in said second surface area.

13. The method of claim 12 wherein said source of radiation scanned over said first reticle outputs an oblong field of radiation having a length substantially parallel to said first side of said first reticle, said oblong field having a first triangular end and a second triangular end, said first triangular end scanning over said second border pattern to produce a graded intensity of said radiation when said source is scanned over said second border pattern.

14. The method of claim 13 wherein said second triangular end is scanned over said fourth border pattern to produce a graded intensity of said radiation when said source is scanned over said fourth border pattern.

15. The method of claim 12 wherein said radiation is partially blocked as said source of radiation scans over said first border pattern by using a movable blind positioned in a radiation path only when said source of radiation scans over said first border pattern.

16. The method of claim 12 wherein said radiation is partially blocked as said source of radiation scans over said first border pattern by using a filter positioned in a radiation path only when said source of radiation scans over said first border pattern.

17. The method of claim 16 wherein said filter is formed on said first reticle over said first border pattern.

18. The method of claim 16 wherein said filter is formed separated from said first reticle.

19. A structure for stitching reticle patterns together on a target substrate, said structure comprising:

a first reticle on an X-Y movable stage in a scanning projection exposure system, said first reticle having a first pattern formed thereon, said first pattern having four sides, said four sides including a first side perpendicular to a direction of scanning of a source of radiation over said first reticle, said first side having a border portion containing a first border pattern; and a means for partially blocking radiation impinging on a substrate as said source of radiation scans over said first border pattern, an intensity of said radiation impinging on said substrate as said source of radiation is scanned over said first border pattern having a graded intensity profile.

20. The system of claim 19 wherein said means for partially blocking said radiation as said source of radiation scans over said first border pattern comprises a movable blind positioned in a radiation path when said source of radiation scans over said first border pattern.

21. The system of claim 19 wherein said means for partially blocking said radiation as said source of radiation scans over said first border pattern comprises a filter positioned in a radiation path when said source of radiation scans over said first border pattern.

22. The system of claim 21 wherein said filter is formed on said first reticle over said first border pattern.

23. The system of claim 21 wherein said filter is formed separated from said first reticle.

* * * * *